United States Patent [19]

Makhijani

[11] 4,321,738

[45] Mar. 30, 1982

[54] APPARATUS AND METHOD FOR REWORK DRESSING OF A CHIP SITE

[75] Inventor: Manik P. Makhijani, Glenham, N.Y.

[73] Assignee: International Business Machines Corp., Armonk, N.Y.

[21] Appl. No.: 36,912

[22] Filed: May 7, 1979

[51] Int. Cl.³ .......................................... B23D 79/02
[52] U.S. Cl. .................................. 29/76 R; 29/81 H; 29/557; 51/310; 228/162; 228/19
[58] Field of Search ............... 228/119, 191, 162, 214, 228/215, 19; 51/310, 311, 262.1, 413, 330, 24; 29/81 H, 76 R, 402.06, 402.07, 557, DIG. 26, 842–845; 427/272

[56] References Cited

U.S. PATENT DOCUMENTS

| | | | |
|---|---|---|---|
| 1,145,654 | 7/1915 | Anderson | 29/557 |
| 1,431,917 | 10/1922 | Antaramian | 51/310 |
| 2,483,424 | 10/1949 | Martines | 427/368 |
| 3,211,354 | 10/1965 | Dugard et al. | 228/19 |
| 3,584,362 | 6/1971 | Hazel et al. | 29/720 |
| 3,646,648 | 3/1972 | Kappelman et al. | 29/76 |
| 3,746,239 | 7/1973 | Auray | 228/19 |
| 3,751,799 | 8/1973 | Reynolds | 228/119 |

OTHER PUBLICATIONS

Schink, K. et al., "Cleaning of Solder Pads Prior to a Rework Operation", from IBM Technical Disclosure Bulletin, vol. 18, No. 5, Oct. 1975, pp. 1384, 1385.
Puttlitz, K. J. et al., "Cleaning of Solder Pads Prior to a Rework Operation", from IBM Technical Disclosure Bulletin, vol. 19, No. 3, Aug. 1976, pp. 939, 940.

*Primary Examiner*—Daniel C. Crane
*Attorney, Agent, or Firm*—Douglas R. McKechnie

[57] ABSTRACT

Apparatus and method for rework dressing a chip site on a substrate prior to rejoining a chip by solder reflow. A compliant mask is aligned and placed on the substrate so that remnant solder columns on chip site pads protrude through holes in the mask. A brush mechanically removes excess solder and dresses any remaining solder columns to uniform shapes and volumes.

11 Claims, 8 Drawing Figures

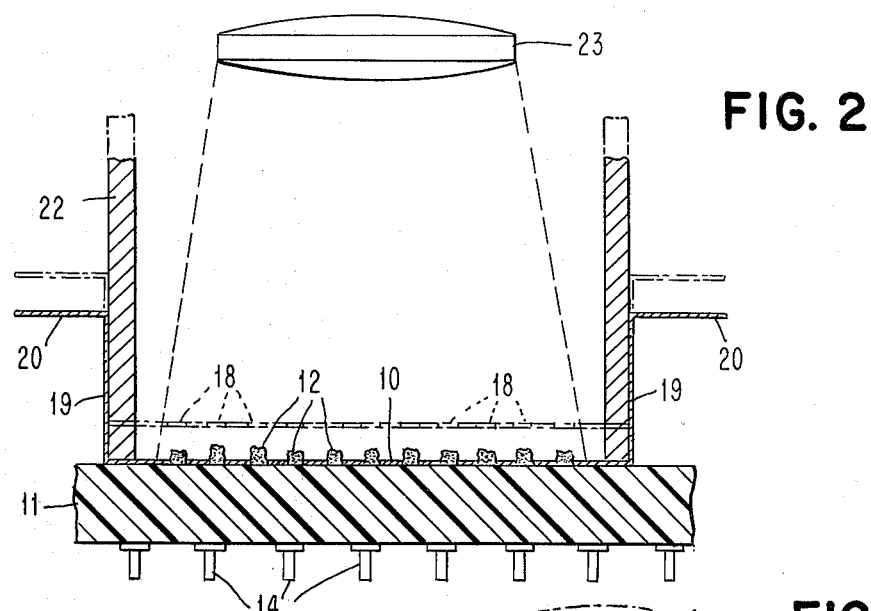
FIG. 2
FIG. 1
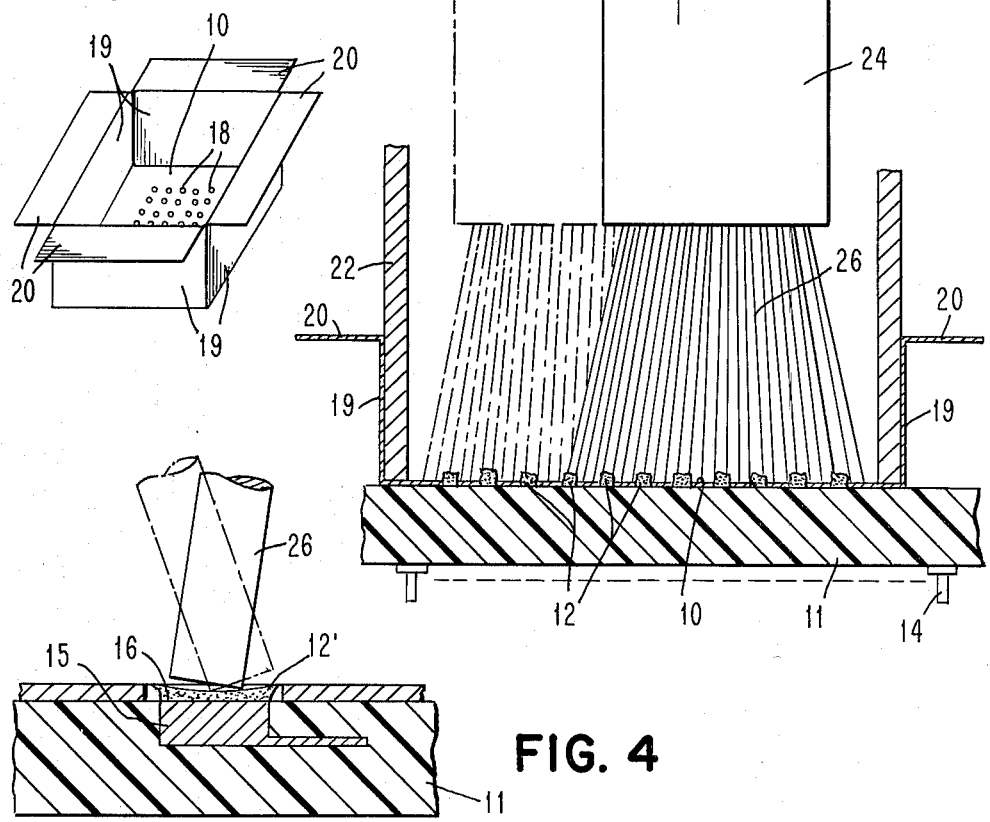
FIG. 3
FIG. 4

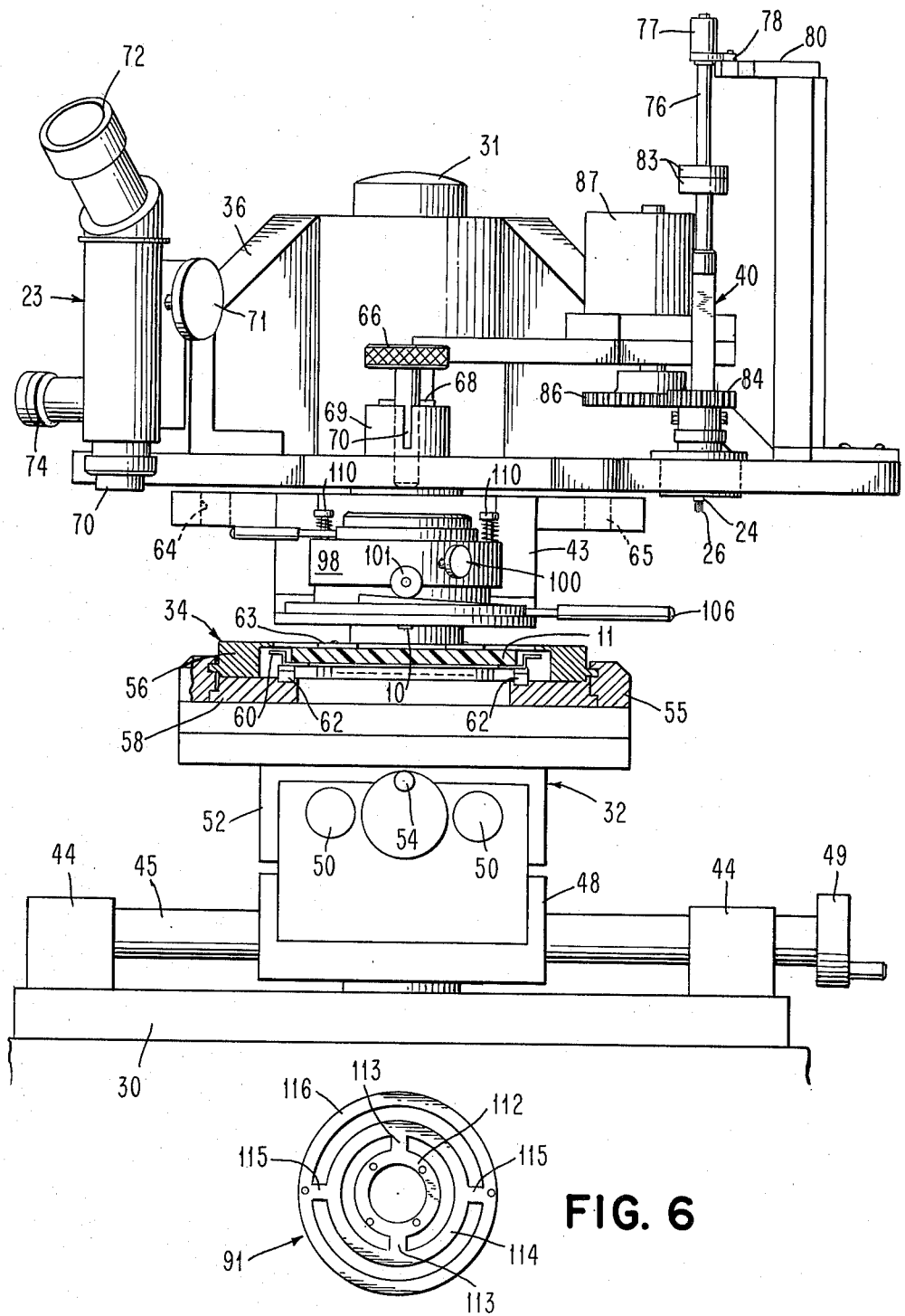

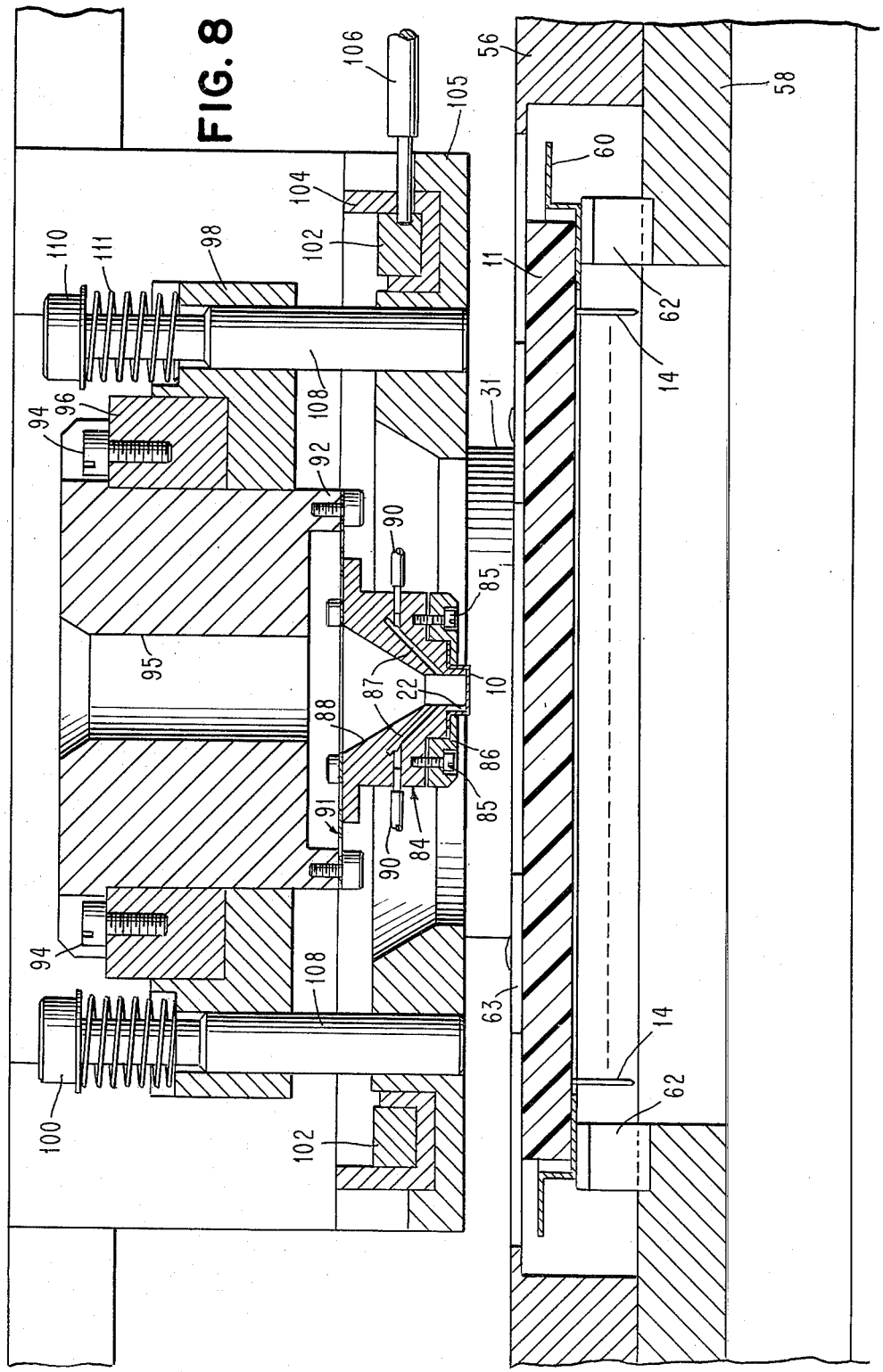

APPARATUS AND METHOD FOR REWORK DRESSING OF A CHIP SITE

TECHNICAL FIELD

This invention relates to a method and apparatus for dressing a chip site during chip rework operations on a semi-conductor device in which semi-conductor chips are attached by solder to a ceramic substrate at chip sites thereon.

BACKGROUND AND PRIOR ART

Semi-conductor devices or modules are known in which a multiplicity of semi-conductor chips are solder-bonded on a ceramic substrate or carrier, at chip sites thereon. In such devices, there is a need for the ability to replace a chip at a given chip site one or more times. To accomplish this, the old chip is removed, the chip site is dressed to remove any excess solder, the chip site is fluxed and a new chip with solder balls thereon is attached by solder reflow. The present invention relates to the step of dressing the chip site.

In conducting a dressing operation, it is desirable that the operation be performed as fast and as cheaply as possible, that it not affect any wires or other chips mounted on the substrate, and that it does not cause any solder bridging between adjacent chip site pads. In addition, in order to prevent the accumulated build-up of solder during subsequent rework operations at the same site, the dressing operation should provide control over the volume of solder that remains after dressing. One problem with volume control is that due to the manner of making the ceramic substrates, the surface of the substrate at chip site is uneven. Additionally, it is also necessary to control the shape of whatever solder remains at the different pads after dressing, in order to facilitate subsequent chip placement and rejoining.

Within the prior art, there are many different methods and apparatus used for chip site dressing. In general, the different ways can be classed as either a thermal method or a mechanical method. In thermal methods, the solder is generally melted and removed either by blowing, sucking, or wetting a wick or simulated chip so that when the wick or chip is removed, it carries with it any excess solder. In mechanical methods, the solder remaining after removal is either flattened or it is shaved off by some form of a cutting tool or chisel. The problem with these mechanical methods is they generally fail to take into account surface unevenness at the chip site and solder columns at high spots will be flattened to a greater extent or cut off more than those at low spots on the chip site, so that the amount or volume of material might differ. In general, such prior art methods fail to achieve all of the desirable results of a successful dressing operation, as discussed above.

SUMMARY OF THE INVENTION

The principal objects of the invention are to provide an improved method and apparatus for dressing a chip site in a manner that is relatively fast and low cost, that controls the volume of any remaining solder even though the substrate might be uneven at the chip site, and that dresses without adversely affecting any other elements on the substrate and without causing any bridging between adjacent chip site patents.

Still another object is to provide method and apparatus for dressing a chip site by use of a mask which guides a solder removal tool so as to control the shapes and volumes of solder columns resulting from the dressing.

Another object is to provide a dressing method and apparatus that is adaptable to different chip site pad configurations and densities.

Briefly, in accordance with the invention, a mask is provided having a series of holes therein arranged in the configuration of the chip site pads. The mask is placed on the chip site with the solder extending upwardly through the holes and a brush is placed against the mask and moved whereby excess solder is scraped from the tops of the remnant solder columns. The brush presses the mask so as to conform to any unevenness in the underlying substrate. After dressing is complete, the remaining solder has a volume controlled primarily by the thickness of the mask and has a slightly concave upwardly facing surface that facilitates chip placements and subsequent rejoining of new chips.

DRAWINGS

Other objects and advantages of the invention will be apparent from the following description taken in connection with the accompanying drawings wherein:

FIG. 1 is an isometric view of a dressing mask used in the invention;

FIG. 2 is an enlarged cross-sectional view, partly schematic, illustrating the mask alignment and placement steps of the invention;

FIG. 3 is a view similar to FIG. 2 illustrating the excess solder removal step of the invention;

FIG. 4 is a greatly enlarged detail view at a chip site pad schematically illustrating a completed solder column and the brushing action;

FIG. 5 is a front elevational view, partly in section, of apparatus embodying the invention;

FIG. 6 is an enlarged plan detail view of a gimbal spring used in such apparatus;

FIG. 8 is an enlarged sectional detail view looking along line 8—8 of FIG. 7.

DETAILED DESCRIPTION

Figure 7:
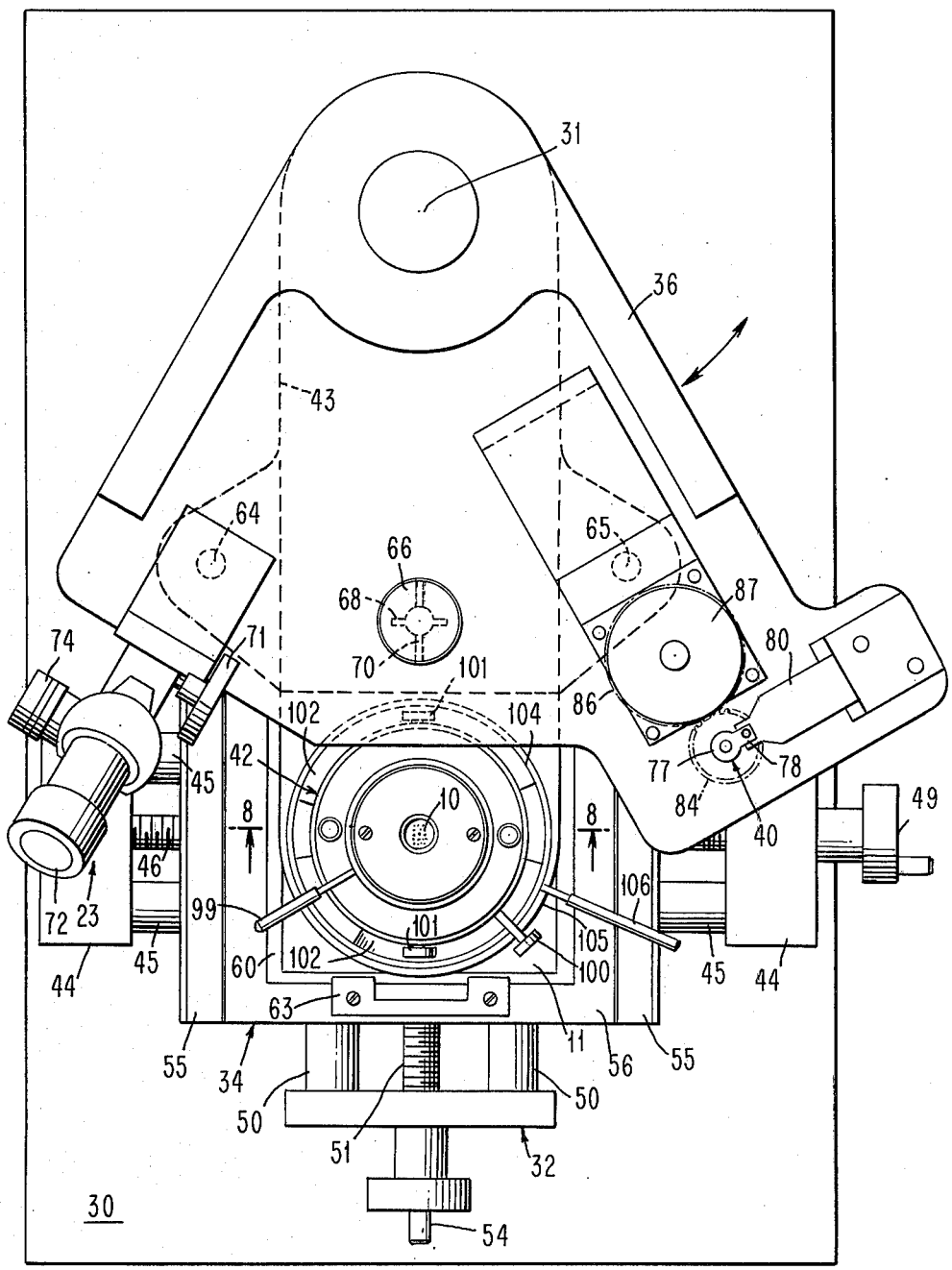
FIG. 7 is a top plan view of the apparatus shown in FIG. 5.

A square shaped mask 10 has a multiplicity of holes 18 arranged in the pattern of solder columns to be dressed. Mask 10 is advantageously formed from a thin sheet of molybdenum which is compliant and has a hardness greater than that of the solder. Mask 10 has a thickness corresponding approximately to the desired height of the finished or dressed solder columns, as pointed out in greater detail hereinafter. Integral with mask 10 are four side walls 19 which extend upwardly and four flanges 20 which extend horizontally and allow the mask to be clamped into a holder as best seen in FIG. 8. The holder has an annular tip 22 with a square exterior designed to fit within side walls 19 and press mask 10 against the top surface of substrate 11.

Substrate 11 has a ceramic body on which are mounted a plurality of contact pins 14 providing electrical connections to the next higher level of packaging. Substrate 11 has a plurality of chip sites thereon, at each chip site there being a plurality of pads 16 (FIG. 4) connected to solder columns 12. Preparatory to beginning the process in accordance with the invention, a chip is removed from one chip site by a manner which leaves the remnant solder columns 12 thereon. One apparatus and method for removing chips is disclosed in U.S. Patent Application Ser. No. 865,768, filed Dec. 29, 1977, by R. H. Meyen et al for "Individual Chip Joining Machine" and assigned to the assignee of the present invention now U.S. Pat. No. 4,160,893. In accordance with such removal, the chip is removed by heating the solder joints through the use of infrared energy, and, when the solder joints have been melted, the chip is sucked upwarded or lifted from the chip site whereby the remaining solder columns will have a generally vertical orientation. Reference may be had to such application for further details of the chip site and for the method of removal.

With reference to FIG. 4, each pad 16 is formed at the top of internal metallization 15 which extends downwardly into the substrate body and may be connected to other pads at the same chip site, to pads at other chip sites, to engineering change pads or to pins 14. The details of such connections and metallization vary according to the functions of the circuitry involved, and such details are not germaine to this invention so that any illustration thereof has been omitted from FIGS. 2 and 3. When a chip has been removed, the problem that occurs is that the various solder columns may have an excess of solder which should be removed to prevent the build-up of solder on each pad through subsequent chip removal operations, and the top surfaces of the remnant solder columns may be such as to interfere with placement of the new chip. The heights of the various solder columns might also differ due to unevenness in the substrate or the manner in which such columns are broken during chip removal. Because of these factors, it is desirable to dress the chip site in accordance with the invention.

In accordance with the method of the invention, mask 10 is moved to a position, shown by the dotted lines in FIG. 2, in which the holes 18 are in vertical alignment with solder column 12. To this end, a long working distance microscope 23, shown schematically in FIG. 2 as a simple lens, may be used. It is expected that the substrate would be mounted for a movement in an X and Y direction and that the mask 10 can be rotated through an angular position so as to achieve the desired orientation. Once the mask is properly aligned above the chip site, then it is moved from the dotted line position to the full line position shown in FIG. 2 wherein mask 10 abuts against the upper surface of substrate 11 and the various solder columns 12 extend upwardly through holes 18.

Next, a brush 24 is lowered inside tip 22, the brush 24 having a multiplicity of bristles 26. Bristles 26 may be of a stainless steel, having diameters less than the diameters of holes 18 and solder columns 12, and having ends which have been dressed or ground at right angles to the body of the bristles to provide sharp corners thereon for scraping away the excess solder. Brush 24 is preferably of an adjustable type in which the bristles can be withdrawn or extended so as to vary the free length thereof. Since the columnar stiffness of the bristles is proportional to their free length, such adjustment allows the stiffness to be adjusted to achieve an optimal clean abrading action. It also allows the bristles to be periodically withdrawn and ground so as to sharpen or square off the ends of the bristles, and thereby prolong the useful life of the brush. Brush assembly 24 is rotated on an eccentric axis in alternate directions a predetermined number of times. Bristles 26 push downwardly along the lengths thereof with a predetermined force in accordance with the columnar stiffness of the bristles. Such force is determined by trial and error so as to achieve the best scraping action. During the course of such rotary movement, the bristles press against the upper surface of the mask and scrape away any excess solder from the solder columns until finished solder columns 12' are formed (FIG. 4). The height of each such column 12' is substantially equal to the thickness of mask 10. The diameter of holes 18 are slightly larger than the diameter of columns 12 and the scraping action causes the upper end of each solder column 12' to have a slightly mushroom shape filling out the upper part of hole 18 and a slightly concave upwardly facing surface. Such concave shapes conveniently receive the solder balls when a new chip is placed upon the old chip site, for joining thereto.

As brush 24 rotates and excess scapes or abrades away the solder, such excess solder or debris may be advantageously removed by use of a vacuum or sucking action. Upon completion of the brushing operation, the mask 10 is moved upwardly away from substrate 11 leaving the desired dressed chip site. Because mask 10 is thin, it is expected that it can be used for only a relatively few number of dressing operations after which it has to be discarded and replaced by a new mask. Should the upper surface of substrate 11 at the chip site be wavy, concave, or convex or otherwise uneven, the forces of bristles 16 pressing as columns along their lengths on the upper surface of mask 10 causes the mask to move against or comply with the upper surface of substrate 11. Thus, as the bristles move over the upper surface of the mask, the mask is forced into compliance with the waviness of substrate 11. Thus, all solder columns 12' resulting from the dressing operation will have a substantially uniform size and shape because of the ability of mask 10 to conform with the surface of substrate 11.

Referring now to FIGS. 5, 7 and 8, the apparatus thereshown comprises a base 30 upon which is mounted a manually actuated X-Y table 32 supporting a substrate holder 34. Substrate 11 is mounted in holder 34 and is manually movable in an orthogonal mode, along X and Y directions, beneath the vertically movable mask 10. Mounted at the rear of base 30 is an upstanding column 31 upon which a movable support 36 is pivotally mounted for rotation about a vertical axis so as to alternately allow long working distance microscope 23 and the brush support assembly 40 to be alternately positioned above mask 10. A stationary support arm 43 is also mounted on column 31 and extends forwardly thereof to support the mask holder assembly 42 above substrate 11.

X-Y mechanism 42 is of conventional construction and includes a pair of stationary blocks 44 mounted upon base 30. Parallel guide bars 45 and a lead screw 46 are mounted on blocks 44 and support the X table 48. Rotation of a crank 49 rotates screw 46 and causes table 48 to move in the X direction. The X table 48 supports a pair of guide bars 50 and lead screw 51 upon which the Y platform or table 52 is mounted. Rotation of crank 54 rotates screw 51 and causes table 52 to move in the Y direction. Supported on the Y table 52 are laterally spaced parallel guide bars 55 which are channeled so as to receive substrate holder 34.

Holder 34 can be of any suitable construction for supporting substrate 11 in a horizontal plane upon X-Y table 32. As shown, holder 34 comprises upper and lower frame members 56 and 58. Substrate 11 is mounted upon a rectangular dished annular flange 60.

Leaf springs 62 are carried by lower frame member 58 and bear against the under side of flange 60 and biases it upwardly. A pair of stops 63 are mounted on the forward and rearward edges of frame 56 and overlie portions of flange 60 whereby springs 62 cause flange 60 to be pressed against stop 63. This causes the upper surface of substrate 11 to be positioned at a work station for interaction with mask 10 during the dressing process.

Support 43 has two laterally spaced holes 64 and 65 which cooperate with a releasable lock pin 66 to lock either microscope 23 or brush assembly 40 above the work station and mask 10. When pin 66 is engaged in hole 65, microscope 23 is positioned above the work station. When pin 66 is engaged in hole 64, brush assembly 40 is positioned above the work station. Lock pin 66 is vertically movable and carries a cross pin 68 which cooperates with a support 69, having a slot 70 therein. When pin 66 is raised and rotated so that pin 68 does not overlie slot 70, it can be released so as to rest on the upper surface of support 69 as shown in FIGS. 5 and 7. At such position, the lower end of pin 66 is above member 43 and allows support 36 to be freely rotated. When it is desired to place pin 66 in one of holes 64 or 65, pin 68 is rotated to overlie slot 70 and then pin 66 can be lowered causing the lower end thereof to enter either hole 64 or 65.

Microscope 23 is of conventional, commercially-available construction and includes a long working distance objective lens 70, an eyepiece 72, focusing knob 71, and a light 74 providing vertical illumination of the work station.

Brush 24 is mounted on the lower end of a vertically movable and rotatable rod 76. A knob 77 is mounted on the upper end of rod 76 and carries a lateral tab 78 having a hole therein for receiving a pin mounted on the upper end of a support 80. When knob 77 is moved upwardly and rotated so that tab 78 overlies support 80, it can be lowered onto such support so that the brush 24 and brush assembly 40 is held in the position in FIG. 5. By disengaging tab 78 from support 80, the brush 24 can be lowered into the working position. Rod 76 is attached to a gear 84 by a slot and pin connection that allows for such vertical movement of rod 76 while causing rotation thereof through gear 84. Weights 83 may be placed on rod 76 to control the force with which brush 24 bears against mask 10. Gear 84 is mounted upon support 36 for rotation relative thereto, it being driven by pinion gear 86 engaged therewith. A selectively actuated reversible motor 87 drives gear 86. In one mode of operation, motor 87 rotates three turns first in one direction and then the other, and such alternate rotation is repeated for a number of cycles. Gears 86 and 84 provide a gear reduction whereby gear 84 is rotated a number of turns (e.g. three) for each turn of gear 86. Rotation of gear 84 causes rod 76 and brush 24 to rotate. As previously indicated, brush 24 is eccentrically mounted and rotates about a slightly eccentric axis within tip 22, during the removal of excess solder.

Referring to FIG. 8, mask 10 is mounted on or connected to a holder 84 by means of a retaining ring 86 that clamps flanges 20 of the mask. Retaining ring 86 is connected by removable screws 85 to the holder. Holder 84 has a central bore 88 therethrough the upper end of which is conically shaped and the lower end of which is cylindrical and passes through tip 22 to provide a clear or open area above mask 10 for optically observing the mask and placing brush 24 thereagainst. Bores 87 extend through holder 84 and are connected to lines 90 which can be connected to a vacuum whereby any debris developed during the brushing operation can be sucked out of the vicinity of the mask and brush in the lower end of bore 88. Holder 84 is connected by a gimbal spring 91 to a cylindrical member 92 having a central bore 95 therein extending above bore 88. Member 92 is connected by screws 94 to a ring 96. By removing screws 94, member 92 and holder 84 can be removed so as to replace mask 10 by disconnecting retainer ring 86.

Ring 96 is mounted in an outer ring 98 and is rotatable relative thereto upon movement of a handle 99 (FIG. 7) when a set screw 100 (FIG. 7) has been loosened. This provides an angular adjustment of the mask 10 relative to a chip site.

Ring 98 is connected to two rollers 101 located at forward and backward sides thereof which rest on the top surfaces of upwardly facing arcuate cam members 102. Cam members 102 are mounted in a rotatable ring 104 mounted in the groove of a stationary ring 105 connected to support 43. A handle 106 is connected to ring 104 and cams 102 so that upon manual movement of a rotation handle 106 through an arc, the cams are moved beneath rollers 101 so as to cause vertical movement of rings 98 and 96, member 92, spring 91 and holder 84 with mask 10 thereon. Mask 10 is movable by such action between a position such as shown in FIG. 8, well above the work station to permit the work piece to be placed in and removed therefrom, to a position immediately above the work piece for alignment purposes, and then into a position where mask 10 contacts substrate 11 in the manner previously described, enabling removal of the excess solder. Such vertical movement is guided by a pair of pins 108 that are press fitted at their lower ends into ring 105 but slidably pass through bores in ring 98. A bolt 110 is connected to the upper end of each pin and a compression spring 111 extends between the lower side of the head of bolts 110 and the upper surface of ring 98. Thus, springs 111 tend to push 98 and the other elements mounted thereon downwardly so as to cause rollers 101 to remain in engagement with cams 102.

As shown in FIG. 6, spring 91 has an inner ring 112 joined by two diametrically opposite lands or narrow portions 113 to a medial ring 114 which in turn is joined by two lands 115 to an outer ring 116. Holes are provided in the outer ring allowing the spring to be connected to member 92 and holes are provided in the inner ring 112 allowing the spring to be connected to holder 84. When the mask 10 is moved downwardly to bear against the upper surface of substrate 11, if such surface is tilted, spring 91 allows holder 84 and mask 10 to tilt to conform to the slope of the surface. Such tilting action, in conjunction with the compliance of mask 10 accommodating any waviness in the surfaces, ensures the correct dressing action.

In carrying out the method of invention by use of the apparatus, a substrate 11 having a chip site to be dressed is placed in holder 34 which is then mounted upon X-Y table 32. Such table can then be moved to locate the desired chip site in the approximate position. Support 36 would be moved upon disengagement, as necessary, of pin 66 so as to swing microscope 23 above bore 95 so as to look or permit downward observation of the upper surface of mask 10. Light 74 is thereupon turned on and through adjustment of the X and Y table, the solder columns 12 can be aligned beneath holes 18 of mask 10. Once so aligned, then, handle 106 is rotated to lower the mask over the solder columns and into engagement with the surface of substrate 11. Thereupon, pin 66 is disengaged and support 36 swung until brush assembly 40 is located above the mask. Knob 77 is then lifted and rotated allowing brush 24 to be lowered through bores 95 and 88 until the bristles thereof rest upon the mask and solder column. Motor 7 is actuated causing brush 24 to rotate whereupon the scraping action of the bristles removes the excess solder and dresses the solder columns. The debris scraped away is removed by the vacuum lines 90. Thereafter, the brush motion is stopped and the brush mechanism elevated to complete the operation.

While only a single embodiment has been shown, it should be apparent to those skilled in the art that many changes can be made in the details and arrangement of parts without departing from the scope of the invention as defined in the appended claims.

Having thus described our invention, what we claim as new and desire to secure by Letters Patents is:

1. The method of dressing a chip site on a substrate wherein a plurality of solder columns extend away from a surface of said substrate and are arranged in a pattern, comprising the steps of:

providing a mask having a plurality of holes arranged in a pattern corresponding to said pattern of solder columns, said mask having a thin body of a uniform thickness corresponding to the heights to which said solder columns are to be dressed;

fitting said mask over said columns on said chip site with one surface of said mask against said substrate and with said solder columns extending through said holes and projecting beyond the other surface of said mask;

and scraping away those portions of said columns projecting beyond said other surface until the heights of said columns are substantially equal to the thickness of said mask.

2. The method of claim 1 wherein:
said mask is of a material harder than said solder columns, and said scraping is done by moving scraping means over the other surface of said mask and against those portions of said solder columns extending beyond said other surface until such portions have been scraped away.

3. The method of claim 2 wherein:
said mask body is flexible,
and said scraping is further done by pressing said scraping means against said other surface so as to flex said body into contact with any uneven portions of the surface of said substrate.

4. The method of claim 2 wherein said scraping means comprises a brush having sharp ended bristles.

5. The method of dressing a chip site on a ceramic substrate which site includes a plurality of solder columns attached to pads on said substrate and extending beyond the surrounding surface of said substrate, comprising the steps of:

providing a thin flat flexible mask having a plurality of holes arranged in a pattern corresponding to said solder columns, said mask having a uniform thickness corresponding to the heights to which said solder columns are to be dressed;

positioning said mask adjacent said chip site with its body of said mask being substantially parallel to said surface of said substrate, sighting said pads through said holes and simultaneously producing relative movement between said mask and said substrate so as to align said solder columns with said holes;

pressing said mask against said surface of said substrate whereby said solder columns extend through said holes;

and scraping away any solder in said columns which extends beyond said mask until the heights of said solder columns are substantially equal to the thickness of said mask.

6. The method of claim 5 wherein:
said pressing is done by allowing said mask to tilt so as to conform said mask to any tilt in said surface of said substrate.

7. The method of claim 6 said scraping is done by means which bears against said mask and flexes it to conform to any unevenness in said surface of said substrate at said chip site.

8. Apparatus for dressing pads of a chip site on a ceramic substrate having a plurality of remnant solder columns on said pads, comprising the combination of:

a base;

first means on said base for holding said substrate and selectively positioning a chip site thereon at a work station;

a mask having a flat thin flexible body provided with a plurality of holes therethrough arranged in a pattern corresponding to the locations of said pads and solder columns, said mask being harder than said solder columns;

a mask holder operatively mounted on said base for supporting said mask at said work station for selective movement between at least one position spaced from said chip site and a second position in which one surface of said mask is pressed against said substrate and said solder columns extend through said holes, said mask holder having an opening therein affording access to one side of said mask away from said substrate;

a support mounted on said base for movement between first and second positions;

optical means mounted on said support and operative, when said support is in said first position, to provide visual observation through said opening of said holes and of said solder columns when said mask holder is in said second position to allow alignment thereof;

a selectively actuated abrading tool operatively mounted on said support, said tool being movable through said opening into engagement with said one side of said mask when said support is in second position;

and selectively actuated drive means connected to operate said tool when engaged with said one side to remove solder from said columns until the height of such columns is substantially equal to the thickness of said mask.

9. The combination of claim 8 wherein:
said tool comprises abrading means operative to remove said solder by abrasion.

10. The combination of claim 8 wherein said holder comprises spring means mounting said mask for movement about plural axes allowing said mask to conform to any tilt of the surface of said substrate engaged thereby.

11. The combination of claim 9 wherein:
said abrading means comprises a brush having elongated stiff bristles of a hardness greater than that of said solder columns, said bristles having sharpened ends, and means mounting said brush for movement in the direction of extent of said bristles to press said mask against said substrate by means of columnar stiffness of said bristles and for movement to cause said ends to abrade said solder columns.

* * * * *